United States Patent [19]
Andermo

[11] Patent Number: 4,878,013
[45] Date of Patent: Oct. 31, 1989

[54] CAPACITIVE TYPE MEASUREMENT TRANSDUCER WITH IMPROVED ELECTRODE ARRANGEMENT

[75] Inventor: Nils I. Andermo, Kirkland, Wash.

[73] Assignee: Mitutoyo Corporation, Tokyo, Japan

[21] Appl. No.: 200,580

[22] Filed: May 31, 1988

Related U.S. Application Data

[63] Continuation-in-part of Ser. No. 30,346, Mar. 26, 1987, abandoned.

[30] Foreign Application Priority Data

Apr. 4, 1986 [JP]  Japan ................................. 61-78948

[51] Int. Cl.<sup>4</sup> ...................... G01R 27/26; G08C 19/16
[52] U.S. Cl. ................................ 324/61 R; 324/61 P; 340/870.37
[58] Field of Search ........................... 324/61 R, 61 P; 340/870.37; 33/125 C; 341/15

[56] References Cited

U.S. PATENT DOCUMENTS

| | | | |
|---|---|---|---|
| 3,222,591 | 12/1965 | Mynall | 340/870.37 |
| 4,217,542 | 8/1980 | Abbe et al. | 324/61 R X |
| 4,420,754 | 12/1983 | Andermo | 340/870.37 |
| 4,459,702 | 7/1984 | Medwin | 324/61 R X |
| 4,586,260 | 5/1980 | Baxter et al. | 33/147 N X |
| 4,654,524 | 3/1987 | Kita | 250/237 G |
| 4,654,581 | 3/1987 | Neukermans et al. | 324/61 R |

FOREIGN PATENT DOCUMENTS

| | | | |
|---|---|---|---|
| 0182394 | 5/1986 | European Pat. Off. | |
| 0214712 | 12/1984 | Japan | 340/870.37 |
| 0127406 | 7/1985 | Japan | 340/870.37 |
| 2118720A | 11/1983 | United Kingdom | 340/870.37 |
| 2139359A | 11/1984 | United Kingdom | 340/870.37 |

Primary Examiner—Reinhard J. Eisenzopf
Assistant Examiner—Jack B. Harvey
Attorney, Agent, or Firm—Oliff & Berridge

[57] ABSTRACT

A capacitive type measuring apparatus comprises first and second electrode arrays mounted on first and second support members which are relatively displaceable with respect to each other. The first electrode array comprises a series of discrete first electrodes uniformly spaced with a pitch $P_r$ defining a scale wavelength and the second electrode array comprises a series of discrete second electrodes arranged so as to define a plurality of electrode groups each having N electrodes, where N is an integer greater than 2. The second electrodes forming each of the electrode groups are positioned within the respective groups so as to respectively occupy predetermined group positions which are distributed over a distance spanning more than one scale wavelength such that each of the group positions corresponds to the relation position of a different one of a set of relative scale wavelength segment positions obtained by dividing the group into intervals corresponding to the scale wavelength, and dividing each interval into N equal segments.

10 Claims, 8 Drawing Sheets

Fig. 8

CAPACITIVE TYPE MEASUREMENT TRANSDUCER WITH IMPROVED ELECTRODE ARRANGEMENT

CROSS-REFERENCE TO RELATED APPLICATION

The present invention is a continuation-in-part application of copending application Ser. No. 07/030,346, filed Mar. 26, 1987, now abandoned.

FIELD OF THE INVENTION

The present invention relates generally to displacement measuring for making linear and angular measurements, and more particularly to capacitive measuring devices.

BACKGROUND OF THE INVENTION

A of capacitive measuring devices for making linear and angular measurements have been developed in which a plurality of discrete, capacitively coupled electrodes are displaced relative to each other, thereby causing electrical signals to be produced can be processed to provide interpolated measurement data. Examples of such devices include applicant's own prior device disclosed in U.S. Pat. No. 4,420,754 (the '754 Patent); and the devices disclosed in U.S. Pat. No. 4,586,260 (Baxter et al) U.S. Pat. No. 4,654,524 (Kita).

Various interdependent factors affect the resolution and accuracy of such measuring devices, including the size and spacing of the electrodes, and the precision of the measuring element geometrics and alignment. Also important are the accuracy and of data interpolation, which are a function of the amount of signal noise, including that caused by extraneous coupling between electrodes, and the sophistication of the electrical signal processing.

It has heretofore not been possible to achieve significant improvements in the resolution of capacitive measuring devices without also substantially increasing the cost and complexity of manufacture, introducing misalignment sensitivity or requiring substantial signal processing. For example, in the case of the transducer disclosed in applicant's aforementioned '754 Patent, the resolution is determined primarily by the scale wavelength (i.e., the distance over which the capacitance function for a given signal phase is repetitive, which corresponds to the pitch of the scale electrodes) and the interpolation rate. The shorter is the scale wavelength, the lower can be the interpolation rate to achieve a given resolution. Conversely, increasing the interpolation rate allows a longer scale wavelength to achieve the same resolution.

However, in the transducer disclosed in applicant's '754 Patent, multiple transmitter electrodes, corresponding to the number of phases in the transmitted signal, are disposed within one scale wavelength, and the transmitter electrodes thus must have a markedly smaller pitch than the scale electrodes. Consequently, significantly decreasing the scale wavelength is limited by the ability to substantially decrease the width of and spacing between the respective transmitter electrodes, and requires changing from relatively simple and inexpensive manufacturing technologies, such as printed circuit technology, to complicated and expensive technologies such as thin film vapor deposition technologies. Similarly, increasing the interpolation rate entails progressively more complicated and expensive circuitry, and is particularly difficult to achieve in the case of the low voltage systems employed in portable, handheld measurement devices such as calipers.

As another example, in the aforementioned Baxter et al system, the transmitter electrodes are divided lengthwise into X and Y groups of electrodes which are in space quadrature. Dual phase high frequency excitation signals are applied to alternate elements of the transmitter electrodes, respectively, and X and Y pickup signals are generated indicative of the signals capacitively coupled from the respective X and Y groups of slider elements to the subjacent receiver electrodes. However, the separate group arrangement of transmitter electrodes causes the Baxter et al system to be extremely sensitive to nonuniformity of the gap between the slider and the scale.

As a further example, the Kita system utilizes two arrays of n and n+m elements, respectively, to produce a set of outputs, the levels of which, when plotted against the successive positions of the elements in one of the arrays, form a wave, the phase of which changes with relative displacement of the two arrays. The displacement is measured by measuring the phase change relative to the pattern of the values of maximum likelihood for the outputs of the elements. However, this measurement technique requires statistical processing of the individual outputs to obtain the position of maximum likelihood of each output, which entails a substantial amount of computations for systems with a large number of array elements.

SUMMARY OF THE INVENTION

It is therefore a principal object of the present invention to provide an improved capacitive measuring device construction which permits shorter scale wavelengths to be obtained with a given manufacturing technology.

It is a further object of the present invention to provide an improved capacitive measuring device construction wherein a given scale wavelength can be achieved more simply and less expensively, and without increasing sensitivity to gap variation or increasing the complexity or amount of the signal processing required to obtain a measurement.

These and other objects of the present invention are achieved by a capacitive measuring device comprising first and second capacitively coupled measuring arrays mounted on first and second relatively displaceable support members, respectively, in alignment with a measurement axis, for producing a varying capacitance pattern in dependence on the relative position of the support members with respect to each other. The first measuring array comprises a series of discrete first electrodes uniformly spaced with a pitch $P_r$ defining a scale wavelength; and the second measuring array comprises a series of discrete second electrodes disposed so as to be capacitively coupled to different portions of the first measuring array in dependence on the relative positions of the support members. The second electrodes are arranged so as to define a plurality of electrode groups each having N electrodes, wherein N is an integer greater than 2, and wherein (i) each of the electrode groups has a uniform group pitch $P_g$ which is a multiple of the scale wavelength; and (ii) the second electrodes forming each of the electrode groups are positioned within the respective groups so as to respectively occupy predetermined group positions spread over a distance greater than one scale wavelength, and which each represents a different one of a set of relative scale wavelength segment positions obtained by dividing the distance spanned by an electrode group into intervals corresponding to the scale wavelength, and dividing each interval into N equal segments. Advantageously, the group electrodes are distributed over the entire span of the group such that at least one second electrode is positioned in each interval of the group.

In accordance with a further aspect of the present invention, the second electrodes are uniformly spaced with a pitch $P_t$, the group pitch $P_g$ is an integral multiple of the scale wavelength, and the electrodes in each group occupy the same sequence of relative group positions from group to group. Alternatively, the second electrodes are non-uniformly spaced, with the electrodes in each group defining at least two sub-groups. The second electrodes in each sub-group are uniformly spaced from each other by a first pitch and the sub-groups are spaced from each other by a second pitch different from the first pitch. Advantageously, the groups of non-uniformly spaced second electrodes define at least one set of groups having a set pitch $P_s$ which is an integral multiple of the scale wavelength, and the sequence of relative group positions occupied by the second electrodes in each electrode group within a group set is different for each group of the set, such that the electrodes of each subgroup within a group occupy different permutations of relative scale wavelength segment positions.

In accordance with a still further aspect of the present invention, N incrementally different periodically varying signals are applied to the respective second electrodes in each group in an order corresponding to the sequence of relative scale wavelength segment positions occupied by the second electrodes in the group, and the outputs the first electrodes capacitively coupled to the second electrodes are summed to form a composite signal from which displacement data is derived.

As a consequence of the present invention, it is possible to obtain the same resolution using second electrodes which have a greater pitch relative to the scale wavelength. This permits either shorter scale wavelengths to be obtained with a given manufacturing technology, or a given scale wavelength to be achieved more readily, without increasing the sensitivity to misalignment or requiring additional or more complicated signal processing.

These and other features and advantages of the present invention are described in or apparent from the following detailed description of preferred embodiments.

BRIEF DESCRIPTION OF THE DRAWINGS

The preferred embodiments will be described with reference to the drawings, wherein like elements have been denoted throughout the Figures with like reference numerals, and wherein.

DETAILED DESCRIPTION OF THE PREFERRED EMBODIMENTS

Figure 1:
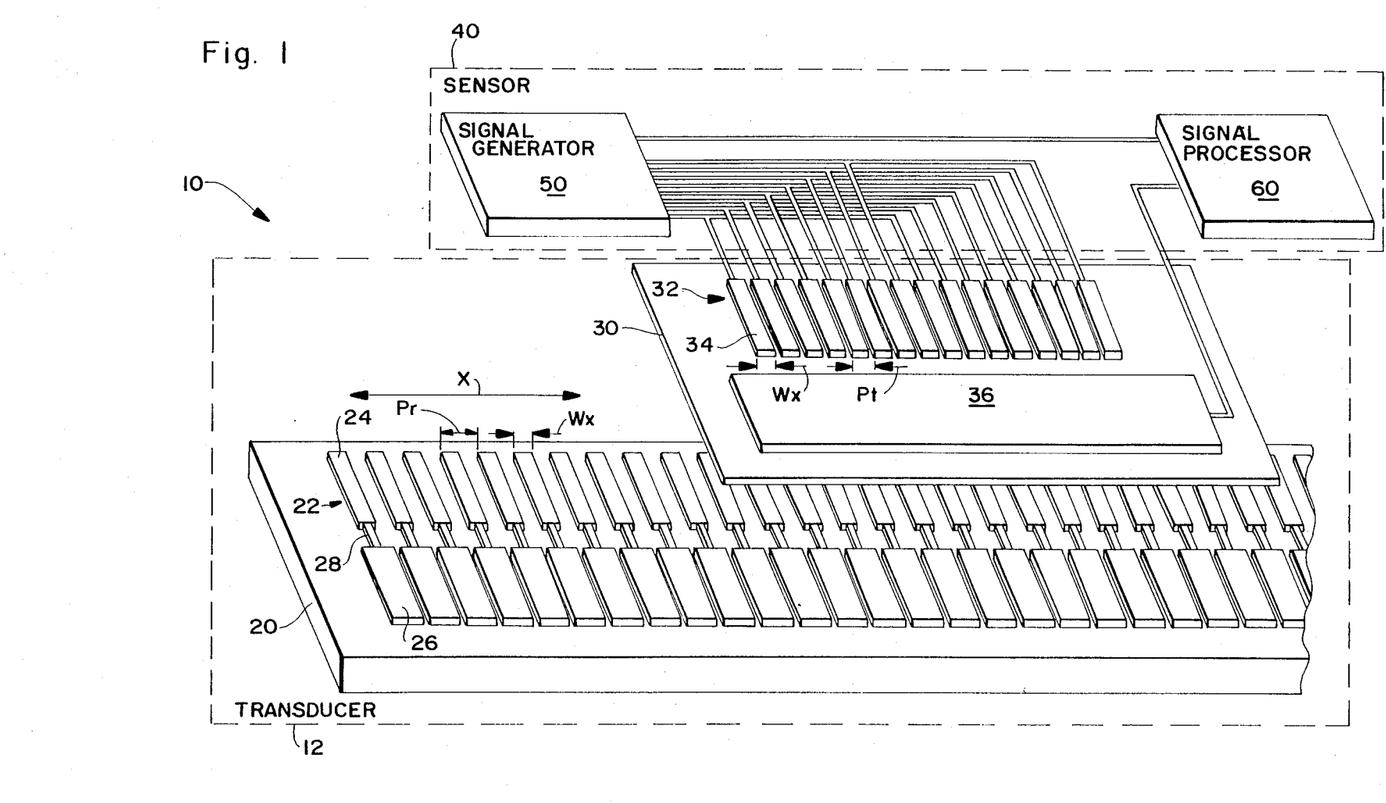
FIG. 1 is a diagrammatic perspective view of a capacitive type caliper having a transducer constructed in accordance with the present invention.

Referring to FIG. 1, a capacitive type linear caliper 10 constructed in accordance with the present invention basically comprises a transducer 12 and a sensor 40. Transducer 12 comprises a linear first support member 20, and a linear second support member 30 slidably mounted on support member 20 for longitudinal axial displacement with respect to member 20 along a measurement axis X. As is conventional, support members 20 and 30 advantageously are provided with extending caliper arms (not shown) which permit dimensional measurements of an object to be made. The gap between support members 20 and 30 advantageously is on the order of 0.05 mm (0.002 inch).

Disposed on the respective support members in opposing relationship to each other and in relative alignment with the measurement axis and the respective caliper arms are first and second arrays, generally denoted 22 and 32, respectively, of electrodes. Electrode array 22 disposed on support member 20 advantageously comprises, as shown, a row of discrete, electrically isolated receiver electrodes 24 which have uniform geometries and which are spaced apart from each other along the measurement axis by a uniform pitch $P_r$ (corresponding edge to corresponding edge distance) in accordance with a predetermined desired scale wavelength. Electrode array 32 disposed on support member 30 advantageously comprises a row of discrete transmitter electrodes 34 disposed so as to be capacitively coupled to differing portions of the electrode array 22 depending o the relative positions of support members 20 and 30. Electrodes 34 are further arranged in a predetermined manner relative to electrodes 24 so as to define a unique capacitance pattern which varies in dependance on the relative positions of the support members with respect to each other, as will be explained in more detail hereinbelow.

Also disposed on the respective support members is a detecting electrode arrangement which permits the capacitive coupling between the first and second arrays 22 and 32 to be sensed. Advantageously, as shown, the detecting electrode arrangement comprises a separate transfer electrode 26 associated with each receiver electrode 24 on support member 20; and a detector electrode 36 disposed on support member 30 adjacent electrodes 34 and in opposing relationship to transfer electrodes 26, so as to be capacitively coupled with the particular transfer electrodes 26 which are associated with the particular portion of electrode array 22 then capacitively coupled to array 32. As shown, transfer electrodes 26 advantageously are disposed in uniform alignment with the associated electrodes 24, and are electrically connected thereto by integrally formed connecting electrodes 28.

Since the signals generated by electrodes 24 and 34 have a substantially sinusoidal strength-to-electrode width (in the measurement direction) relationship, the measurement direction width $w_x$ of electrodes 24 and 34 is preferably chosen to be approximately one-half the receiver electrode pitch $P_r$. It will be appreciated that the width $w_x$ can be less than half the pitch $P_r$ if desired, consistent with the sensitivity of the electronic circuitry selected to perform the signal processing. As shown, transfer electrodes 26 advantageously are dimensioned to have a maximum surface area in relation to detector electrode 36 so as to provide maximum signal transfer between electrodes 26 and electrode 36. It is important that detector electrode 36 have a measurement direction width such that the signal transfer via the transmission paths defined by transmitter electrodes 34, the capacitively coupled receiver electrodes 24, transfer electrodes 26 and detector electrode 36 are substantially uniform for all transmission paths. Consequently, as shown, detector electrode 36 should extend sufficiently beyond the series of transmitter electrodes 34 in both measurement axis directions, e.g., by a distance greater than $1P_r$, that any electric field induced by the transmitter electrodes into the receiver electrodes has attenuated to a negligible level at the respective ends of detector electrode 36. Alternatively, the detector electrode 36 should be sufficiently shorter than the electrode array 32 such that the electrode field at the ends of electrode 36 is uniform and edge effects from the ends of the electrode array 32 are avoided. In addition, when detector electrode 36 is shorter than the electrode array 32, the effective length of detector electrode 36 must be an integral multiple of the transmitter electrode group pitch $P_g$ (defined hereinbelow).

It will be appreciated that, if desired, electrode array 22 may be disposed on movable support member 30 and electrode array 32 may be disposed on support member 20, instead of the arrangement shown in FIG. 1.

Sensor 40 senses the capacitive coupling between the first and second arrays 22 and 32 of transducer 12 by measuring phase ratios between input and output signals and converts the ratio information to data indicative of the relative measurement direction displacement between the two support members 20 and 30. In accordance with the present invention, N different periodically varying signals generated by a signal generator 50, where N is an integer greater than 2, are applied to groups of the respective transmitter electrodes in a predetermined sequence to be described in more detail hereinbelow. The resultant output signals produced by detector electrode 36 are fed to a signal processor 60, where they are compared in a conventional manner with reference signals to derive measurement data. Advantageously, as will be described in more detail hereinbelow, signal generator 50 is a multi-phase signal generator which generates N periodic signals each having the same amplitude and frequency, but phase shifted with respect to each other in incremental steps equal to 360/N degrees, and signal processor 60 measures the resulting phase shift in the transducer output signal obtained by detector electrode 36.

Turning to the arrangement of transmitter electrodes 34, the measurement direction width of the individual transmitter electrodes can be significantly increased relative to the scale wavelength by arranging the electrodes so as to define a plurality of electrode groups each having N number of electrodes 34 and each having a uniform group pitch $P_g$ (defined as the edge-to-edge distance between the initial electrodes in adjacent groups) that is a multiple of the scale wavelength. Within each electrode group, electrodes 34 are positioned so as to respectively occupy N group positions which are spread over a distance greater than one scale wavelength, and each of which corresponds to the relative position of a different one of a set of relative wavelength segment positions obtained by dividing the distance spanned by an electrode group into intervals corresponding to the scale wavelength, and dividing each interval into N equal segments. Advantageously, the group electrodes are distributed over the entire measurement direction width of the group such that at least one electrode 34 is positioned in each interval of the group.

Figure 2:
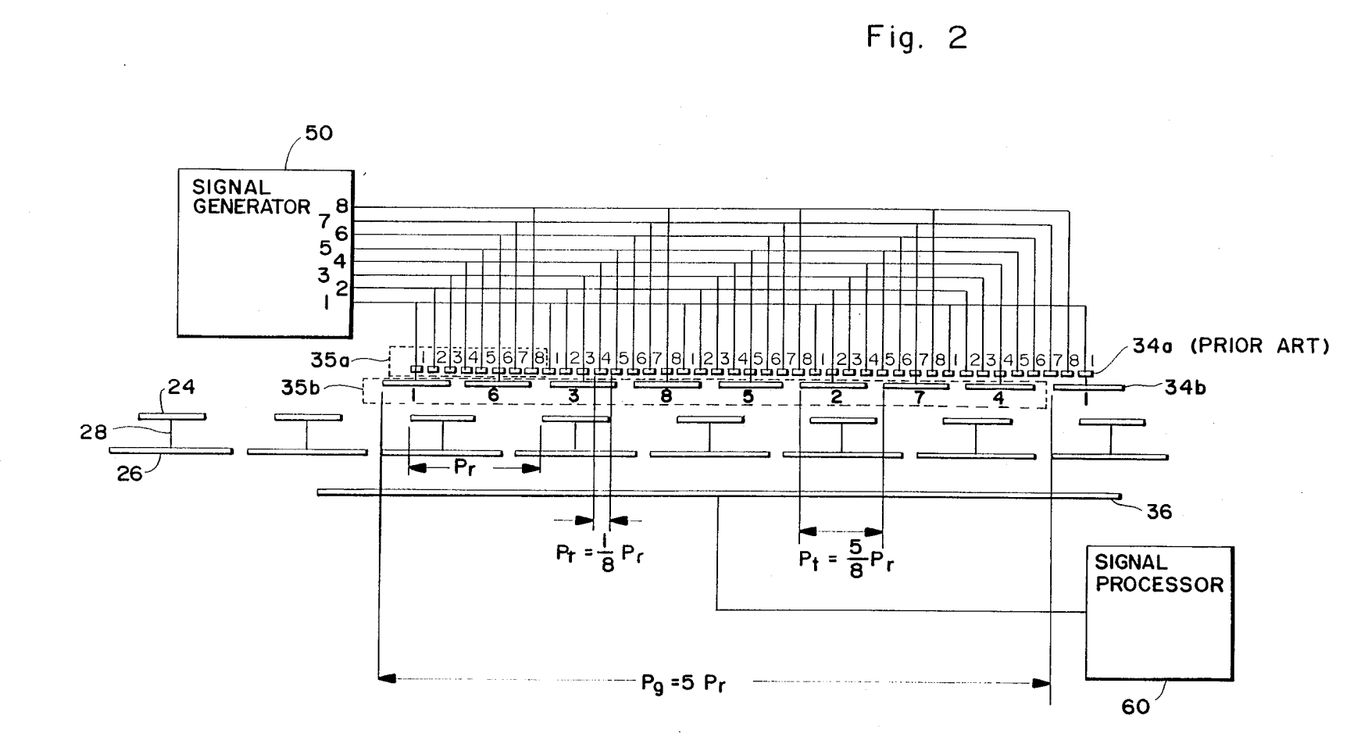
FIG. 2 is a diagrammatic comparison of a conventional capacitive type transducer electrode arrangement and a transducer electrode arrangement according to the present invention.

To assist in understanding this aspect of the present invention, the respective electrode arrangements for a conventional transducer as disclosed in applicant's aforementioned '754 Patent and for a transducer according to the present invention, with both transducers adapted for use with a signal generator 50 producing a sequence of eight incrementally different output signals, have been diagrammatically shown in superposed relationship in FIG. 2. As shown, the transmitter electrodes 34a of the conventional transducer are positioned relative to the receiver electrodes 24 with a pitch $P_t$ equal to $\frac{1}{8}$ of the scale wavelength (receiver electrode pitch $P_r$). The eight output signals produced by signal generator 50 are respectively connected in repeating ascending numerical order (1-2-3-4-5-6-7-8) sequence to transmitter electrodes 34a, as shown, such that plural identical groups 35a of electrodes 34a are defined, the electrodes of which are respectively connected in order to the different sequential signal generator output signals. As can be seen, the electrodes 34a of each group 35a are distributed over a distance corresponding to a single scale wavelength (receiver electrode pitch $P_r$).

In contrast, transmitter electrodes 34b have, in accordance with the present invention, been positioned relative to receiver electrodes 24 with a pitch $P_t = \frac{5}{8} P_r$. The resulting group pitch $P_g$ of a group 35b of eight transmitter electrodes 34b is thus equal to five scale wavelengths ($P_g = 5 P_r$). Further, based on a division of the group into five scale wavelength intervals, and a division each scale wavelength interval into 8 segments, it can be seen that transmitter electrodes 34b for each electrode group 35b occupy positions within the group such that at least one transmitter electrode 34b is disposed within each of the scale wavelength intervals of the group, and such that each group electrode position corresponds to the relative position of a different scale wavelength segment. Using a numerical order numbering sequence to identify the relative scale wavelength segment positions, the transmitter electrodes 34b in each group 35b are positioned in a 1-6-3-8-5-2-7-4 sequence of relative scale wavelength segment positions.

In accordance with the present invention, the eight signal generator output signals are connected to the electrodes 34b of each electrode group in the same 1-6-3-8-5-2-7-4 sequence, as shown. As a consequence of the transmitter electrode arrangement of the present invention, the individual receiver electrodes 24 receive signals from the transmitter electrodes 34b that are uniquely different depending on which part of the transmitter array is disposed opposite the receiver electrodes. Since the detector electrode 36 does detect, via transfer electrodes 26, the sum of all of the signals produced by the receiver electrodes which are in opposing relationship with the transmitter electrodes, as determined by the position of scale member 30 relative to scale member 20, the resulting sum signal fed to a signal processor does vary with the relative positions of the two scale members 20 and 30 in substantially the same way as with the conventional transmitter electrode configuration shown in applicant's aforementioned '754 patent. The only significant difference is that the receiver electrode signals must be integrated over a length spanning multiple scale wavelengths to obtain the same capacitance function as in applicant's '754 patent embodiment. However, the present invention allows the same result to be achieved with a much wider transmitting electrode pitch, which in turn permits the use of much wider transmitter electrodes relative to the scale wavelength.

Figure 3:
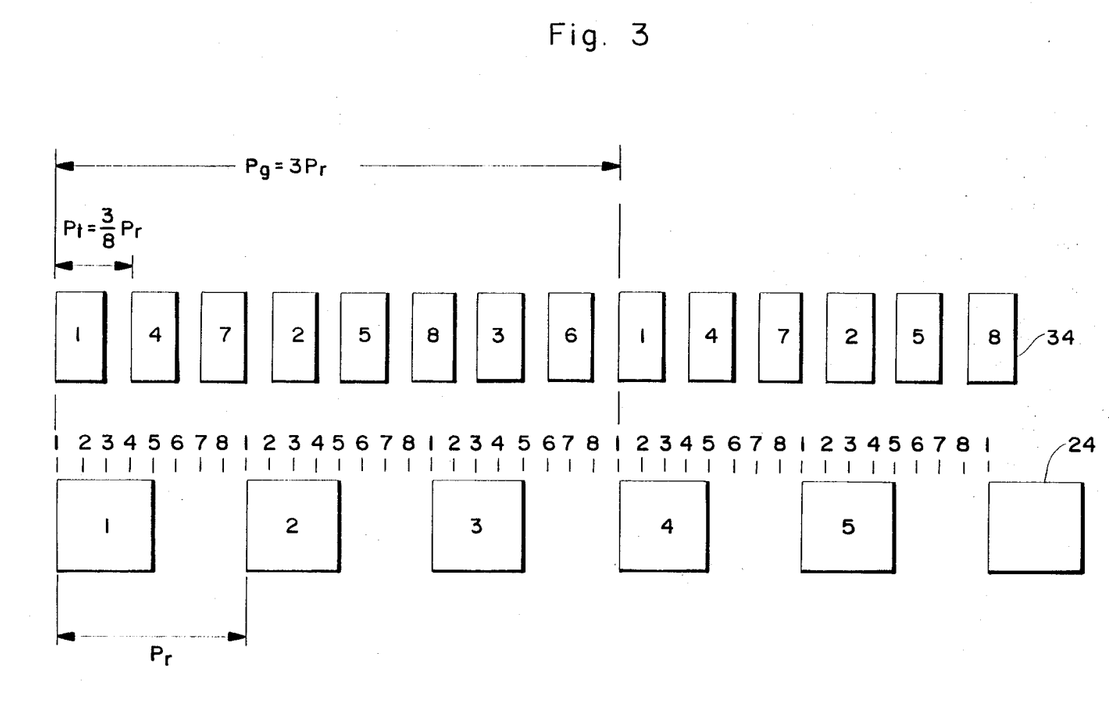
FIGS. 3–7 are diagrammatic views of alternative electrode arrangements in accordance with the present invention.

It will be appreciated that, for a given number N of signal generator output signals, there are several transmitter electrode pitches which permit N electrodes t be distributed uniformly over a multiple of the scale wavelength at different relative scale wavelength segment positions as described hereinabove. One such alternative electrode configuration for measuring systems in which N=8 is illustrated in FIG. 3. In the arrangement of FIG. 3, the transmitter electrode pitch $P_t = \frac{5}{8} P_r$, and the respective transmitter electrodes 34 in each group have relative scale wavelength segment positions corresponding to the sequence 1-4-7-2-5-8-3-6, as shown. Other possible arrangements include those in which $P_t = \frac{7}{8} P_r$ and $P_t = 9/8 P_r$. The relative scale wavelength segment position sequences for these latter arrangements are 1-8-7-6-5-4-3-2 and 1-2-3-4-5-6-7-8, respectively.

Figure 4:
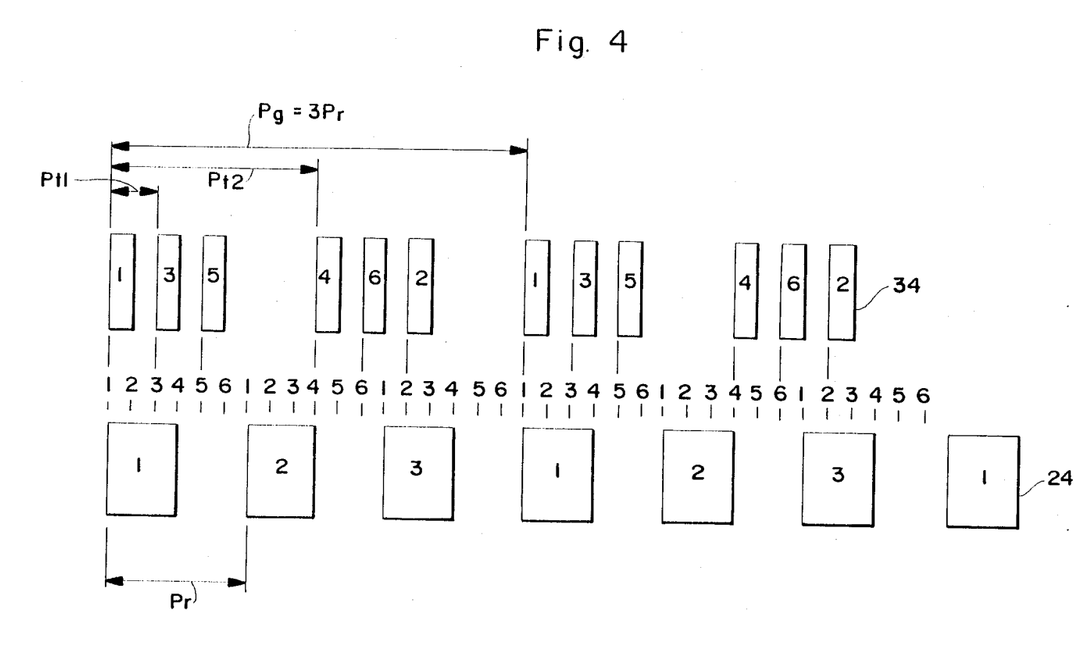

Although the transmitter electrodes 34 advantageously are uniformly spaced with a pitch $P_t$, the group pitch $P_g$ is an integral multiple of the scale wavelength, and the electrodes in each group occupy the same sequence of relative scale wavelength segment positions from group to group, as is the case with the foregoing embodiments, it is not necessary that the transmitter electrodes have a uniform pitch. FIG. 4 illustrates an electrode arrangement for N=6 wherein the transmitter electrodes in each group are arranged in two subgroups. As shown, the group pitch $P_g = 3 P_r$, the electrodes in each of the sub-groups are uniformly spaced from each other by a first pitch $P_{t1} = 2/6 P_r$, and the sub-groups are uniformly spaced from each other by a second pitch $P_{t2}$, greater than the first pitch $P_{t1}$ ($P_{t2} = 9/6 P_r$). The arrangement of the electrodes 34 within each group of the FIG. 4 embodiment still results in at least one electrode being positioned in each of the scale wavelength intervals of the group, with each group position constituting a different relative scale wavelength segment position, similarly to the embodiments described hereinabove wherein the electrodes are spaced within the groups with a uniform pitch.

Figure 5:
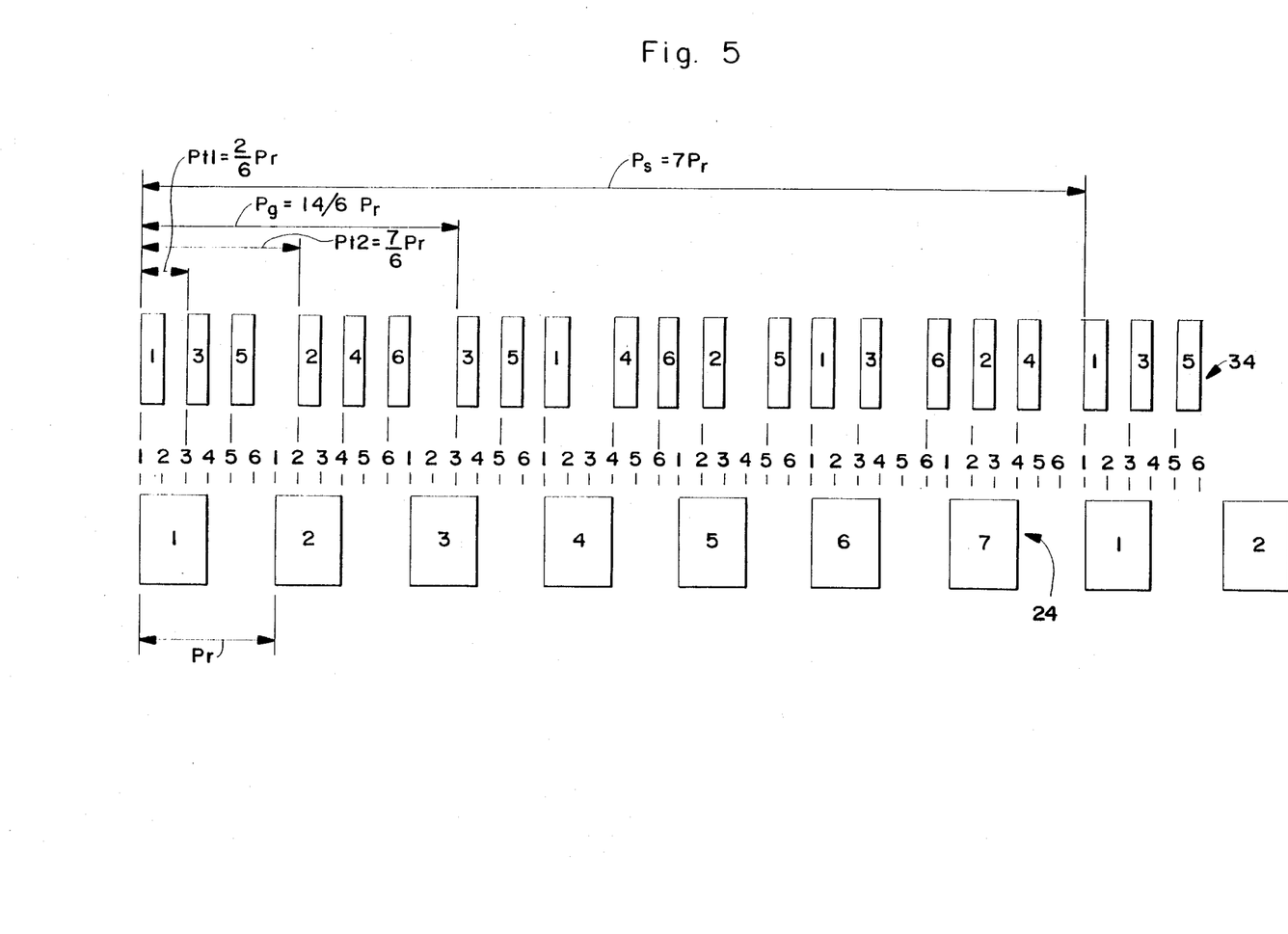
Figure 6:
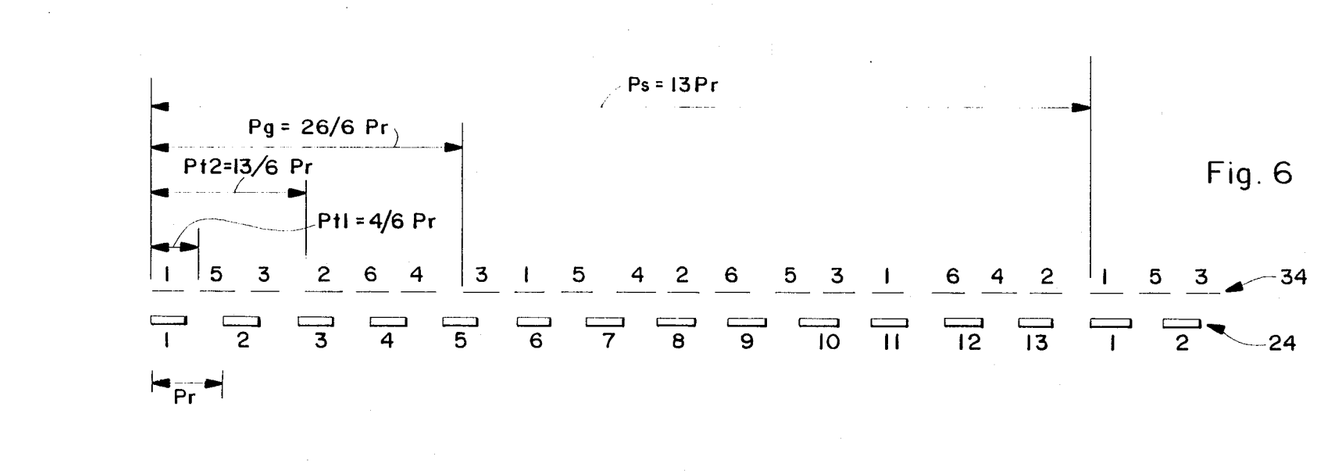
Figure 7:
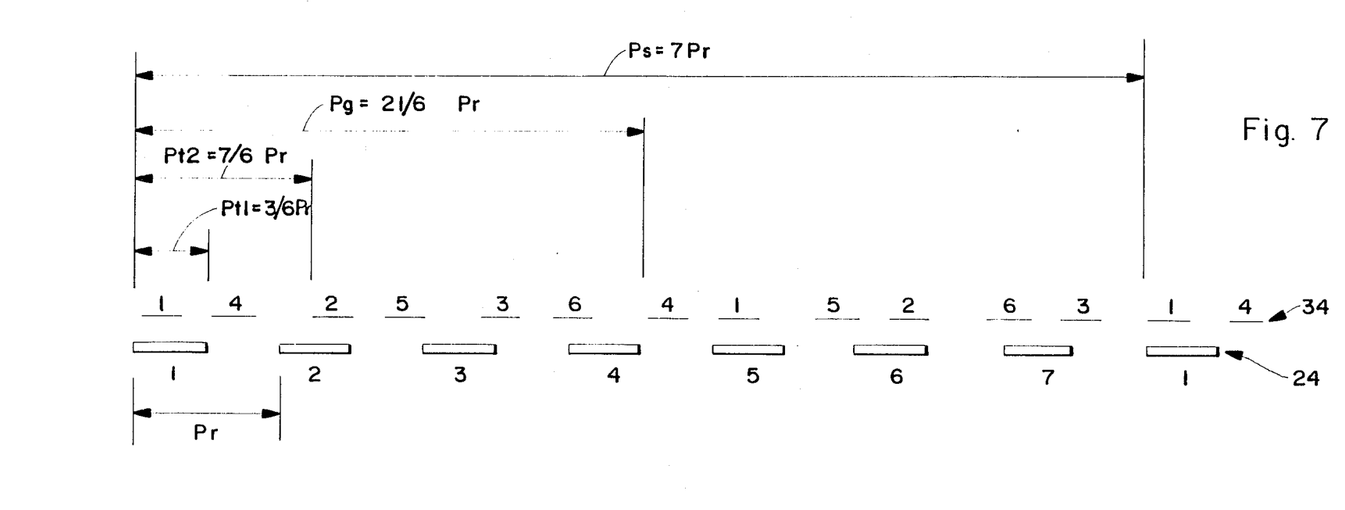

Further, as shown in the embodiments of FIGS. 5-7, with non-uniformly spaced transmitter electrodes, the electrodes can advantageously be arranged so as to define at least one set of electrode groups having a set pitch $P_s$ which is an integral multiple of the scale wavelength. Further, as shown, the sequence of relative sc le wavelength segment positions occupied by the transmitter electrodes 34 in each electrode group within a set of groups is different for each group of the set, and for each sub-group within each group of the set, such that all signal phases have the same transfer function over the group set. Referring specifically to FIG. 5, which shows a first alternative arrangement for N=6, the electrode groups define a set of three groups having a set pitch $P_s = 7 P_r$. Each group consists of two subgroups of three electrodes each, like the embodiment of FIG. 4. The electrodes in each sub-group are spaced from each other by the same pitch $P_{t1} = 2/6 P_r$ as the electrodes in the FIG. 4 embodiment, but the sub-groups have a smaller pitch $P_{t2} = 7/6 P_r$, and the pitch of each group is $P_g = 14/6 P_r$. As can be seen, the relative scale wavelength segment position sequence for the electrodes in each subgroup is a different permutation across the entire set of groups: 1-3-5, 2-4-6, 3-5-1, 4-6-2, 5-1-3, 6-2-4. As a consequence, the transfer function is the same for all signal phases across the distance spanned by the set of groups, and all signal phases experience the same set of conditions regarding capacitive edge effects and capacitance to neighboring electrodes, thus reducing the interpolation errors.

The embodiment of FIG. 6 is similar to that of FIG. 5, except that $P_s = 13 P_r$, $P_g = 26/6 P_r$, $P_{t1} = 4/6 P_r$ and $P_{t2} = 13/6 P_r$. In the embodiment of FIG. 7, each group consists of three sub-groups of two electrodes each. The pitch between electrodes in each subgroup is $P_{t1} = 3/6 P_r$, the pitch of each sub-group is $P_{t2} = 7/6 P_r$ and the pitch of each group is $P_g = 21/6 P_r$. The electrode groups define a set of two groups having a set pitch $P_s = 7 P_r$.

It will be further appreciated that the choice of N, the number of discrete signals used to derive the capacitance transfer function between the respective transmitter electrodes and receiver electrodes which are disposed in a capacitively coupled relationship, is influenced by the accuracy required and the degree of complexity of the sensing apparatus which can be afforded. The interpolation error decreases as the value of N increases. However, the higher the value of N, the more costly are the signal generating and processing circuits which must be used, and the greater are the number of connections required between the transducer and the signal generating circuitry, which increases the sources of error.

Figure 8:
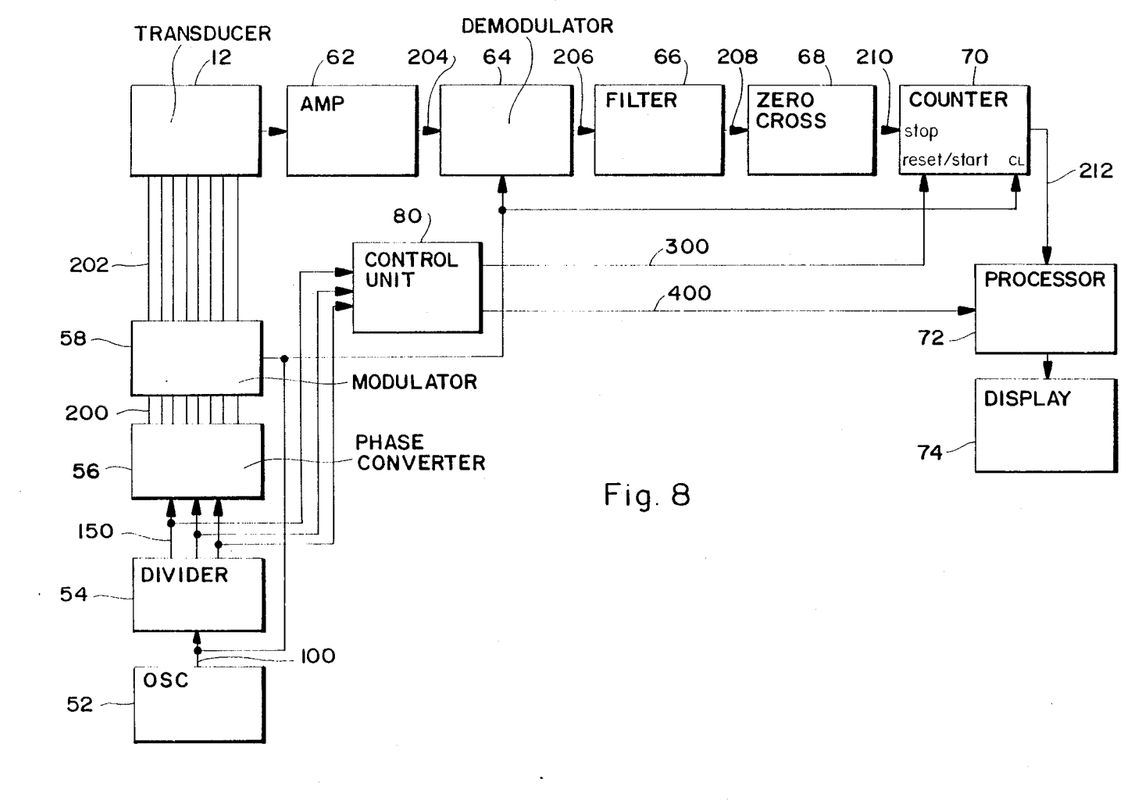
FIG. 8 is a schematic block diagram of exemplary signal generating and processing apparatus which can be used with the transducer of the present invention.
Figure 9:
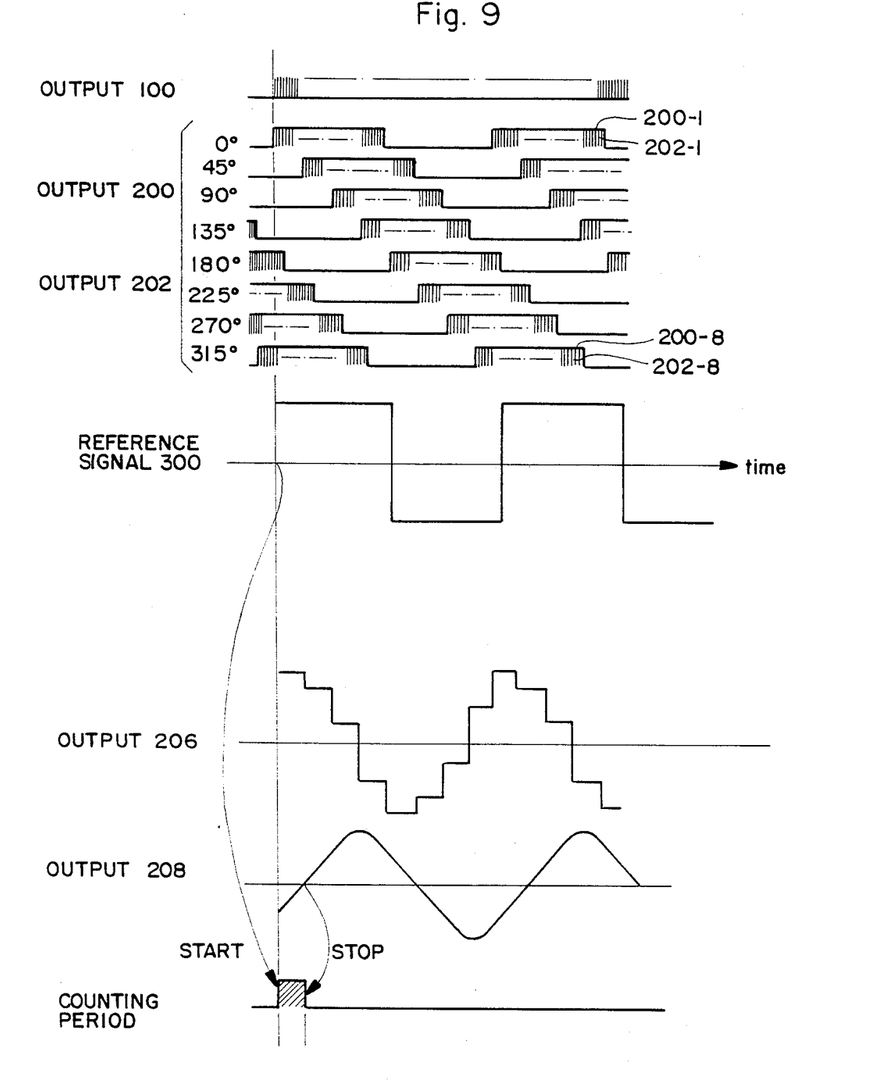
FIG. 9 is a timing chart of various signal waveforms produced by the apparatus of FIG. 8.

Turning to FIGS. 8 and 9, an exemplary embodiment of sensor 40 for sensing the capacitive coupling between electrode arrays 22 and 32 of transducer 10 will now be described.

Signal generator 50 comprises an oscillator 52 for producing a continuous square wave output high frequency (HF) signal 100 having a frequency $f_o$, a frequency divider 54 for dividing the oscillator output signal 100 into three corresponding lower frequency signals 150, a phase converter 56 for converting the signals 150 into eight control signals 200-1 to 200-8 having uniform pulse widths and repetition rates which are generated in successive, 45° phase-shifted, relationship to each other, and a modulator 58 for modulating the oscillator output 100 with the eight signals 200-1 to 200-8, so as to produce eight phase-shifted excitation signals 202-1 to 202-8, as shown in FIG. 9. It will be appreciated that modulation of output signal 100 advantageously is accomplished by inverting (180° phase-shifting) signal 100 in response to the pulse signals 200, such that each excitation signal 202 is a continuous output signal of frequency $f_o$, but having relatively inverted portions in accordance with the associated pulse signal 200. Advantageously, modulator 58 comprises a series of EXCLUSIVE-OR gates each having one input connected to a corresponding one of the signals 200 and the other input connected to the HF signal 100. When the signal 200 for a gate is high, the signal 202 outputted by the gate is the signal 100 inverted; and when signal 200 for a gate is low, the signal 202 outputted by the gate is the noninverted signal 100. For the sake of clarity, only the envelope of signals 200 have been illustrated. The respective excitation signals 202-1 to 202-8 are connected to the groups of transmitter electrodes 34 of transducer 12 in the manner described hereinabove.

Signal processor 60 comprises an amplifier 62 for amplifying the composite HF modulated square wave signal output produced by detector electrode 36 of transducer 12, a synchronous demodulator 64 controlled by the output 100 of oscillator 52 for demodulating the amplified transducer signal 204 produced by amplifier 62 to produce a composite square wave envelope output signal 206, as shown, a filter 66 for eliminating harmonics in the demodulated output signal 206, leaving only fundamental components and thereby producing a substantially sinusoidal signal 208, as shown, a zero crossing detector 68 for producing a control signal 210 when signal 208 crosses zero in predetermined direction, a counter 70 for counting the oscillator output signal 100 under control of a reference control signal 300 produced by a control unit 80 connected to the start/reset input of the counter and the control signal 210 produced by zero crossing detector 68 connected to the stop input of the counter, a data processor 72 for converting the count outputs 212 of counter 70 into numerical displacement values, and a display 74 for displaying the output of data processor 90. The reference control signal 300 produced by control unit 80 is produced in synchronism with the generation of one of the respective control signals 200, e.g., 200-1, as shown, in response to the control signals 150 produced by divider 54. The operation of data processor 72 is controlled in a conventional manner by a further control signal 400 produced by control unit 80 in synchronism with the generation of a complete cycle of control signals 200-1 to 200-8.

As will be appreciated by those of ordinary skill in the art, the output of transducer 12 (output signal 206) is similar in form to the output produced by the transducer configuration shown in applicant's '754 Patent, and reflects the distribution of the capacitance function in the measurement direction across the signal paths defined by transmitter electrodes 34, receiver electrodes 24, connecting electrodes 28, transfer electrodes 26 and detector electrode 36. However, the output of transducer 12 is an averaged signal obtained over a length spanning multiple scale wavelengths, rather than a single scale wavelength. The phase shift of the filtered transducer output relative to the timing of the input signals which produce the output still has a linear relationship to the relative displacement of the transducer support members with respect to each other (over a displacement range of one scale wavelength); that is, $\phi = dx/P_r(360°)$, where dx is the measurement distance. As is apparent from the foregoing, the time between the start of a count in counter 70, which occurs simultaneously with the generation of one of the signals 200, and the end of a count, which occurs when the processed transducer output signal 208 crosses zero, represents the phase shift to be measured, and is readily converted to a numerical value representing the measurement distance dx.

Since the output of transducer 12 has the same form as that produced by the transducer shown in applicant's '754 patent, the signal processing circuits shown in FIGS. 9 and 14-16 of the '754 Patent, modified to provide filtering of harmonics from the transducer output, may advantageously be employed as signal generator 50 and signal processor 60. The disclosure of the aforementioned circuits in applicant's '754 Patent is hereby incorporated in the present application by reference.

An alternative to the continuous signal processing circuitry described above, which alternative utilizes dual-ramp integration of the outputs produced by selected pairs of signals 202, is disclosed in applicant's copending application entitled "Capacitance-Type Measuring Device For Absolute Measurement Of Positions", filed simultaneously herewith, which copending application is also hereby incorporated herein by reference.

It will be appreciated that the foregoing preferred embodiments are merely illustrative of the present invention, and that numerous modifications can be made therein consistently with the spirit and scope of the present invention. In particular, while the present invention has been described as implemented in portable, hand-held linear measurement calipers, it will be appreciated by those of ordinary skill in the art that the present invention is not limited to such measuring devices, and can be implemented for a variety of linear and angular measurement applications, including large-scale measuring devices such as three-dimensional coordinate measuring systems and numerically-controlled finishing machines.

I claim:

1. Capacitive-type measuring apparatus comprising:

first and second support members, said support members being relatively displaceable with respect to each other, and at least one of said support members being displaceable relative to a measurement axis;

first and second electrode arrays mounted on said first and second support members, respectively, in alignment with said measurement axis, for producing a varying capacitance pattern in dependence on the relative positions of said support members with respect to each other;

said first electrode array comprising a series of discrete first electrodes uniformly spaced with a pitch $P_r$ defining a scale wavelength;

said second electrode array comprising a series of discrete second electrodes disposed so as to be capacitively coupled to differing portions of said first electrode array in dependence on the relative positions of said support members; and said second electrodes being arranged so as to define a plurality of measuring element groups separated from each other by a group pitch Pg, and wherein each electrode group has N measuring elements, N being an integer greater than 2, and the second electrodes forming each of said electrode groups are positioned within the respective groups so as to respectively occupy predetermined group positions which are spread over a distance greater than one scale wavelength, and each of which corresponds to the relative position of a different one of a group of relative scale wavelength segments obtained by dividing the group pitch into intervals corresponding to the scale wavelength and dividing each interval into N equal segments;

signal generator means for applying at least one combination of N periodic excitation signals to the second electrodes in each of said electrode groups such that said excitation signals are respectively applied to corresponding ones of the second electrodes in each group in a relative order corresponding to the sequence of relative scale wavelength segment positions occupied by the electrodes in each group; and detector means comprising:

detector electrode means for sensing the output signals produced by the first electrodes capacitively coupled to said second electrode array in response to said at least one combination of excitation signals, and for producing an output signal which represents a sum of the sensed first electrode output signals; and signal processing means for deriving measurement data from said detector electrode means output signal.

2. The measuring apparatus of claim 1 wherein said signal generator means includes means for generating N successively different excitation signals.

3. The measuring apparatus of claim 1 wherein said signal generator means includes means for generating N successively different combinations of said excitation signals.

4. The measuring apparatus of claim 1 wherein said second electrodes are uniformly spaced with a pitch $P_t$ such that said group pitch $P_g$ is an integral multiple of the scale wavelength; and at least one second electrode is positioned in each group interval.

5. The measuring apparatus of claim 1 wherein the second electrodes within each of said second electrode groups are grouped in at least two sub-groups, the second electrodes in each of said sub-groups being uniformly spaced from each other by a first pitch and said sub-groups being uniformly spaced from each other by a second pitch different from said first pitch.

6. The measuring apparatus of claim 5 wherein a plurality of said second electrode groups define a set of groups having a set pitch $P_s$ which is an integral multiple of the scale positions occupied by the second electrodes of the group set is different for each group of the set and for each sub-group within the groups of the set.

7. The measuring apparatus of claim 1 wherein said signal generator means generates N signals which are successively incrementally phase-shifted from each other in steps of 360/N degrees.

8. The measuring apparatus of claim 5 wherein said signal processing means comprises means for filtering harmonics from said detector electrode means output signal to obtain a substantially sinusoidal measurement signal, and means for measuring the phase of said measurement signal relative to one of said excitation signals to obtain measurement data.

9. Capacitive-type measuring apparatus comprising:

first and second support members, said support members being relatively displaceable with respect to each other, and at least one of said support members being displaceable relative to a measurement axis;

first and second electrode arrays mounted on said first and second support members, respectively, in alignment with said measurement axis, for producing a varying capacitance pattern in dependence on the relative positions of said support members with respect to each other;

said first electrode array comprising a series of discrete first electrodes uniformly spaced with a pitch $P_f$ defining a scale wavelength;

said second electrode array comprising a series of discrete second electrodes disposed so as to be capacitively coupled to differing portions of said first electrode array in dependence on the relative positions of said support members; and said second electrodes being arranged so as to define a plurality of measuring element groups separated from each other by a group pitch $P_g$, and wherein each electrode group has N measuring elements, N being an integer greater than 2, and the second electrodes forming each of said electrode groups are positioned within the respective groups so as to respectively occupy predetermined group positions which are spread over a distance greater than one scale wavelength, and each of which corresponds to the relative position of a different one of a group of scale wavelength segments obtained by dividing the group pitch into intervals corresponding to the scale wavelength and dividing each interval into N equal segments; and the second electrodes within each of said second electrode groups further being grouped in at least two sub-groups, the second electrodes in each of said sub-groups being uniformly spaced from each other by a first pitch and said sub-groups being uniformly spaced from each other by a second pitch different from said first pitch.

10. The measuring apparatus of claim 9 wherein a plurality of said second electrode groups define a set of groups having a set pitch $P_s$ which is an integral multiple of the scale wavelength, and the sequence of relative scale wavelength segment positions occupied by the second electrodes in each electrode group of the group set is different for each group of the set and for each sub-group within the groups of the set.

* * * * *